United States Patent
Shinagawa et al.

(10) Patent No.: US 10,038,101 B2
(45) Date of Patent: Jul. 31, 2018

(54) MEMORY CELL AND NON-VOLATILE SEMICONDUCTOR STORAGE DEVICE

(71) Applicant: Floadia Corporation, Kodaira-shi, Tokyo (JP)

(72) Inventors: Yutaka Shinagawa, Kodaira (JP); Yasuhiro Taniguchi, Kodaira (JP); Hideo Kasai, Kodaira (JP); Ryotaro Sakurai, Kodaira (JP); Yasuhiko Kawashima, Kodaira (JP); Tatsuro Toya, Kodaira (JP); Kosuke Okuyama, Koadira (JP)

(73) Assignee: FLOADIA CORPORATION, Tokyo (JP)

( * ) Notice: Subject to any disclaimer, the term of this patent is extended or adjusted under 35 U.S.C. 154(b) by 0 days.

(21) Appl. No.: 15/515,199

(22) PCT Filed: Oct. 6, 2015

(86) PCT No.: PCT/JP2015/078333
§ 371 (c)(1),
(2) Date: Mar. 29, 2017

(87) PCT Pub. No.: WO2016/060011
PCT Pub. Date: Apr. 21, 2016

(65) Prior Publication Data
US 2017/0222036 A1    Aug. 3, 2017

(30) Foreign Application Priority Data
Oct. 15, 2014 (JP) .................................. 2014-211095

(51) Int. Cl.
*H01L 29/788* (2006.01)
*H01L 29/792* (2006.01)
(Continued)

(52) U.S. Cl.
CPC .......... *H01L 29/788* (2013.01); *H01L 29/792* (2013.01); *G11C 11/34* (2013.01); *H01L 45/04* (2013.01)

(58) Field of Classification Search
CPC ............. H01L 29/42344; H01L 29/788; H01L 29/792; H01L 45/04
See application file for complete search history.

(56) References Cited

U.S. PATENT DOCUMENTS 7,411,242 B2    8/2008    Kobayashi et al.
8,945,997 B2 *  2/2015    Zhang ................... H01L 29/792
                                              257/314
(Continued)

FOREIGN PATENT DOCUMENTS

JP    2002-164449 A    6/2002
JP    2005-142354 A    6/2005
(Continued)

OTHER PUBLICATIONS

English translation of International Search Report from Corresponding Application No. PCT/JP2015/078333; dated Dec. 8, 2015.
(Continued)

Primary Examiner — Victor A Mandala
(74) Attorney, Agent, or Firm — Pearne & Gordon LLP (57) ABSTRACT

A voltage applied to a bit line or to a source line is reduced to a value allowing a first or second select gate structure to block electrical connection between the bit line and a channel layer or between the source line and the channel layer, irrespective of a voltage needed to inject charge into a charge storage layer by a quantum tunneling effect. In accordance with the reduction in voltage(s) applied to the bit line and the source line, thickness of each of a first and second select gate insulating films of the first and second select gate structure is reduced. High-speed operation is achieved correspondingly. With the reduction in voltage(s)

(Continued)

applied to the bit and source lines, thickness of a gate insulating film of a field effect transistor in a peripheral circuit controlling a memory cell is reduced. The area of the peripheral circuit is reduced correspondingly.

4 Claims, 6 Drawing Sheets

(51) Int. Cl.
  *H01L 45/00*   (2006.01)
  *G11C 11/34*   (2006.01)

(56) References Cited

U.S. PATENT DOCUMENTS

| | | |
|---|---|---|
| 2006/0071265 A1 | 4/2006 | Koh et al. |
| 2009/0050956 A1 | 2/2009 | Ishimaru et al. |
| 2011/0175156 A1 | 7/2011 | Okuyama |
| 2011/0233649 A1* | 9/2011 | Shimizu ............ H01L 21/28282 257/324 |
| 2012/0230120 A1 | 9/2012 | Tori |
| 2014/0175533 A1* | 6/2014 | Kwon ............... H01L 21/28282 257/324 |

FOREIGN PATENT DOCUMENTS

| | | |
|---|---|---|
| JP | 2009-054707 A | 3/2009 |
| JP | 2010-278314 A | 12/2010 |
| JP | 2011-129816 A | 6/2011 |
| JP | 2011-146612 A | 7/2011 |
| WO | 2011/064866 A1 | 6/2011 |

OTHER PUBLICATIONS

Office Action from Corresponding Application No. JP 2014-211095; dated Feb. 16, 2016.
Schuegraf, Klaus, et al., "Hole Injection SiO2 Breakdown Model for Very Low Voltage Lifetime Extrapolation", IEEE Transactions on Electron Devices, vol. 41, No. 5, May 1994, pp. 761-767.
Extended European Search Report issued in Patent Application No. EP 15 85 1362 dated Apr. 18, 2018.

* cited by examiner

| | Read | | Prog | | Erase | |
|---|---|---|---|---|---|---|
| | SELECTED-COLUMN | NON-SELECTED COLUMN | SELECTED-COLUMN | NON-SELECTED COLUMN | | |
| MGL | 0 | 0 | 12 | 12 | -12 | |
| SGL | 1.5 | 1.5 | 0 | 0 | 0 | |
| DGL1 | 1.5 | 1.5 | 1.5 | 1.5 | 0 | SELECTED ROW |
| | 0 | 0 | 0 | 0 | 0 | NON-SELECTED ROW |
| BL1 | 1.5 | 0 | 0 | 1.5 | 0 | |
| SL | 0 | 0 | 0 | 0 | 0 | |
| MPW | 0 | 0 | 0 | 0 | 0 | |

MEMORY CELL AND NON-VOLATILE SEMICONDUCTOR STORAGE DEVICE

TECHNICAL FIELD

The present invention relates to a memory cell and a non-volatile semiconductor memory device.

BACKGROUND ART

Japanese Patent Laid-Open Publication No. 2011-129816 (Patent Document 1) discloses a memory cell in which a memory gate structure is disposed between two select gate structures (see FIG. 16 in the Patent document 1). The memory cell includes a drain region, to which a bit line is connected, and a source region, to which a source line is connected. Over a memory well, the first select gate structure, the memory gate structure, and the second select gate structure are arranged in this order in a direction towards the source region from the drain region. In the memory cell, the memory gate structure includes a charge storage layer. Data is programmed by injecting charge into the charge storage layer or erased by removing charge from the charge storage layer.

To inject charge into the charge storage layer in the above-described memory cell, a low bit voltage from the bit line is applied to a channel layer below the memory gate structure through the first select gate structure while the second select gate structure, which is connected to the source line, blocks the voltage. At this time, a high memory gate voltage is applied to the memory gate electrode of the memory gate structure. Charge is injected into the charge storage layer by a quantum tunneling effect caused by a voltage difference between the bit voltage and the memory gate voltage.

In a non-volatile semiconductor memory device in which the above-configured memory cells are arranged in a matrix of rows and columns, the memory cells share a memory gate line to which a high memory gate voltage is applied. In a case where a high memory gate voltage is applied to the memory gate line to inject charge into the charge storage layer of one of the memory cells, the high memory gate voltage is applied also to the memory gate electrodes of the remaining memory cells that share the memory gate line although the charge is not supposed to be injected into the charge storage layers of the remaining memory cells.

In the memory cell in which the charge is not supposed to be injected into the charge storage layer, a high bit voltage is applied from the bit line to the channel layer of the memory gate structure through the first select gate structure while the second select gate structure, which is connected to the source line, blocks a voltage to be applied to the channel layer. Thus, in the case where a high memory gate voltage is applied to the memory gate electrode of the memory gate structure, a high bit voltage is applied to the channel layer, making a voltage difference between the memory gate electrode and the channel layer small. As a result, the quantum tunneling effect does not occur and the charge is not injected into the charge storage layer.

CITATION LIST

Patent Literature

Patent Literature 1: Japanese Patent Laid-Open Publication No. 2011-129816

SUMMARY OF INVENTION

Technical Problem

In order not to inject charge into a charge storage layer of a conventional memory cell, it has been required to apply a high bit voltage through a bit line to a channel layer in accordance with a high memory gate voltage, to prevent charge injection into the charge storage layer. In such a memory cell, a select gate insulating film of the first select gate structure connected to the bit line needs to be thick enough to withstand the high bit voltage. Correspondingly, it has been difficult to achieve high-speed operation.

To prevent the charge injection into the charge storage layer of the conventional memory cell, a high bit voltage may be applied to the bit line. Hence, a gate insulating film of a field effect transistor in a peripheral circuit that controls the memory cell needs to be thick enough to withstand the high bit voltage. Accordingly, a problem arises that the area of the peripheral circuit needs to be increased with the thickness of the gate insulating film.

In view of the foregoing, an object of the present invention is to provide a memory cell enabling operation with higher speed and including a peripheral circuit having the smaller area, as compared with those of a conventional memory cell, and a non-volatile semiconductor memory device.

Solution to Problem

In order to solve the above problems, a memory cell of the present invention includes a drain region, a source region, a memory gate structure, a first select gate structure, and a second select gate structure. The drain region is disposed on a surface of a memory well. A bit line is connected to the drain region. The source region is disposed on the surface of the memory well. A source line is connected to the source region. The memory gate structure is disposed between the drain region and the source region. The memory gate structure includes a lower memory gate insulating film, a charge storage layer, an upper memory gate insulating film, and a memory gate electrode stacked in this order over the memory well. The first select gate structure includes a first select gate electrode and a first select gate insulating film. The first select gate electrode is disposed through the first select gate insulating film over the memory well between the drain region and the memory gate structure. The first select gate structure is adjacent to a first sidewall of the memory gate structure through a first sidewall spacer. The second select gate structure includes a second select gate electrode and a second select gate insulating film. The second select gate electrode is disposed through the second select gate insulating film over the memory well between the source region and the memory gate structure. The second select gate structure is adjacent to a second sidewall of the memory gate structure through a second sidewall spacer. In a case where a charge storage gate voltage needed to inject charge into the charge storage layer by quantum tunneling effect is applied to the memory gate electrode and a channel layer is formed in a surface region of the memory well facing the memory gate electrode, the first select gate structure blocks electrical connection between the drain region and the channel layer and the second select gate structure blocks electrical connection between the source region and the channel layer, and a depletion layer is formed to surround the channel layer having a channel potential raised in accordance with the charge storage gate voltage. The depletion layer prevents the channel potential from being applied to the first and second select gate insulating films from the channel layer while charge injection into the charge storage layer is prevented by reducing a voltage difference between the memory gate electrode and the channel layer.

A memory cell of the present invention includes a drain region, a source region, a memory gate structure, a first select gate structure, and a second select gate structure. The drain region is disposed on a surface of a memory well. A bit line is connected to the drain region. The source region is disposed on the surface of the memory well. A source line is connected to the source region. The memory gate structure is disposed between the drain region and the source region. The memory gate structure includes a lower memory gate insulating film, a charge storage layer, an upper memory gate insulating film, and a memory gate electrode stacked in this order over the memory well. The first select gate structure includes a first select gate electrode and a first select gate insulating film. The first select gate electrode is disposed through the first select gate insulating film over the memory well between the drain region and the memory gate structure. The first select gate structure is adjacent to a first sidewall of the memory gate structure through a first sidewall spacer. The second select gate structure includes a second select gate electrode and a second select gate insulating film. The second select gate electrode is disposed through the second select gate insulating film over the memory well between the source region and the memory gate structure. The second select gate structure is adjacent to a second sidewall of the memory gate structure through a second sidewall spacer. The charge storage layer is disposed only in a region through which the memory gate electrode faces the memory well, and the charge storage layer is in neither of the first sidewall spacer nor the second sidewall spacer. The first sidewall spacer is disposed between the memory gate structure and the first select gate structure. The second sidewall spacer is disposed between the memory gate structure and the second select gate structure. The width of each of the first and second sidewall spacers is greater than or equal to 5 nm and less than or equal to 40 nm. The thickness of each of the first and second select gate insulating films is less than or equal to 3 nm.

In the above-described memory cell, the depletion layer is formed to surround the channel layer, in which the channel potential is raised in accordance with the charge storage gate voltage, by allowing the first select gate structure to block the electrical connection between the drain region and the channel layer and by allowing the second select gate structure to block the electrical connection between the source region and the channel layer, even when the charge storage gate voltage needed to inject the charge into the charge storage layer by the quantum tunneling effect is applied to the memory gate electrode and the channel layer is formed in the surface region of the memory well facing the memory gate electrode. Thereby, the depletion layer prevents the channel potential (from the channel layer) from being applied to the first select gate insulating film and the second select gate insulating film while the charge injection into the charge storage layer is prevented by making the voltage difference between the memory gate electrode and the channel layer small.

A non-volatile semiconductor memory device according to the present invention includes the memory cells described above. The memory cells are disposed in a matrix of rows and columns. At least one bit line and at least one source line are connected to the memory cells.

Advantageous Effects of Invention

According to the present invention, the voltage applied to the bit line or the voltage applied to the source line is reduced to a value which allows the first select gate structure or the second select gate structure to block electrical connection between the bit line and the channel layer or between the source line and the channel layer, irrespective of the charge storage gate voltage needed to inject charge into the charge storage layer by the quantum tunneling effect. In accordance with the reduction in voltages on the bit line and the source line, the thickness of the first select gate insulating film of the first select gate structure and the thickness of the second select gate insulating film of the second select gate structure are respectively reduced. High-speed operation is achieved correspondingly.

According to the present invention, the voltages to be applied to the bit line and the source line are reduced. Therefore the thickness of a gate insulating film of a field effect transistor of a peripheral circuit that controls the memory cell is reduced. The area of the peripheral circuit is reduced correspondingly.

DESCRIPTION OF EMBODIMENTS

Hereinafter, embodiments of the present invention will be described in the following order.
1. Overall configuration of non-volatile semiconductor memory device 2. Specific configuration of memory cell
3. Principles of operation to inject charge into charge storage layer in selected memory cell
4. Principles of operation not to inject charge into charge storage layer in non-selected memory cell, in which high charge storage gate voltage is applied to memory gate electrode
5. Voltages during various operations in non-volatile semiconductor memory device
6. Configuration of charge storage layer in memory cell of the present invention
7. Operations and Effects
8. Other embodiments (1) Overall Configuration of Non-volatile Semiconductor Memory Device In FIG. 1, a numeral 1 denotes a non-volatile semiconductor memory device. The non-volatile semiconductor memory device includes memory cells 2a, 2b, 2c, and 2d of the present invention. The memory cells 2a, 2b, 2c, and 2d are arranged in a matrix of rows and columns. Of the memory cells 2a, 2b, 2c, and 2d, the memory cells 2a and 2c (or 2b and 2d), which are arranged in a first direction (in this case, in a column direction), share one bit line BL1 (or BL2) in the non-volatile semiconductor memory device 1. A bit voltage application circuit 10 applies a bit voltage to each of the bit lines BL1 and BL2. In the non-volatile semiconductor memory device 1, the memory cells 2a and 2b (or 2c and 2d), which are arranged in a second direction (in this case, a row direction) orthogonal to the first direction, share one first select gate line DGL1 (or DGL2). A first select gate voltage application circuit 11 applies a first select gate voltage to each of the first select gate lines DGL1 and DGL2.

Figure 1:
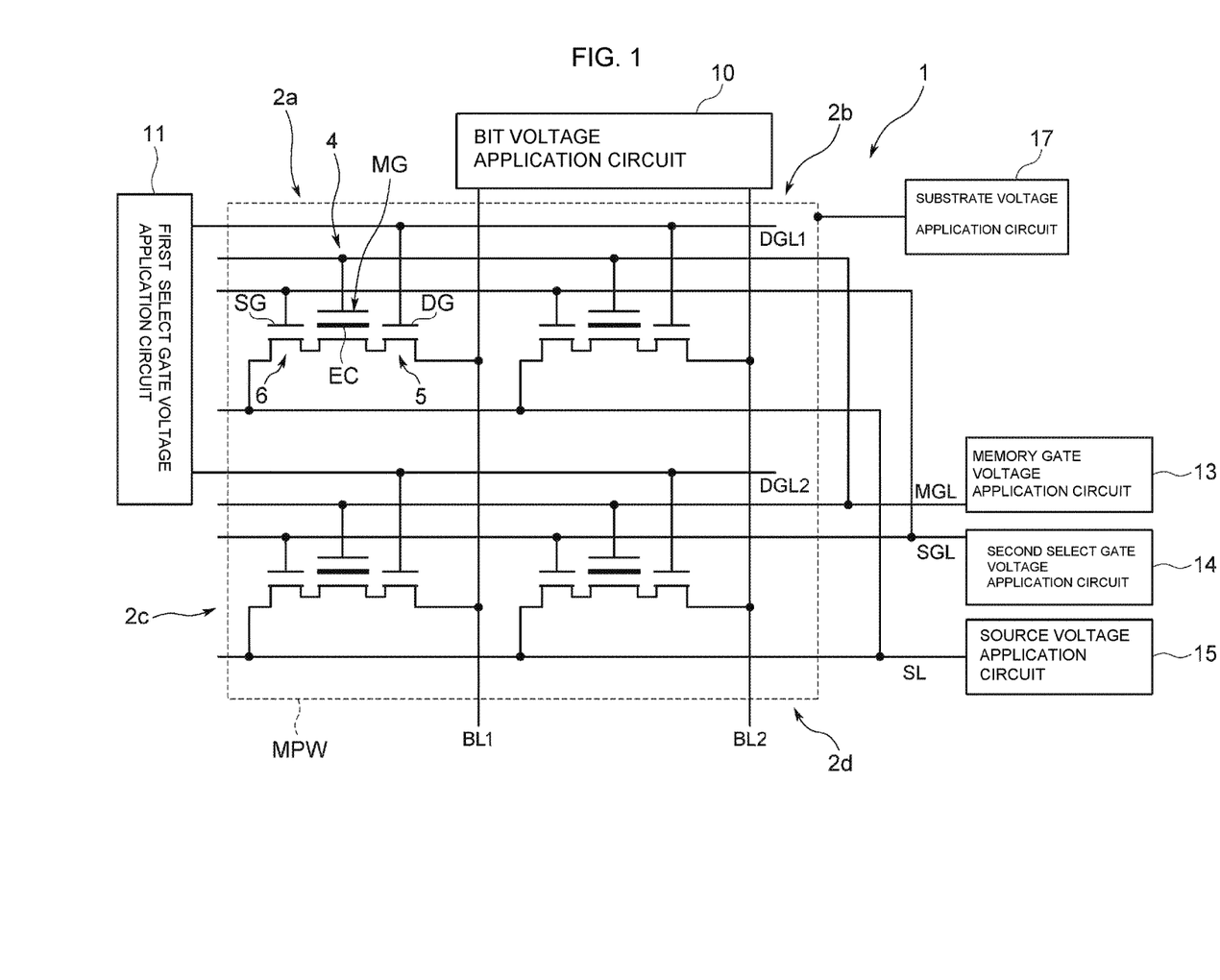
FIG. 1 is a circuit diagram illustrating a circuit configuration of a non-volatile semiconductor memory device including memory cells of the present invention.

In the non-volatile semiconductor memory device 1 according to this embodiment, the memory cells 2a, 2b, 2c, and 2d share one memory gate line MGL, one second select gate line SGL, and one source line SL. A memory gate voltage application circuit 13 applies a memory gate voltage to the memory gate line MGL. A second select gate voltage application circuit 14 applies a second select gate voltage to the second select gate line SGL. A source voltage application circuit 15 applies a source voltage to the source line SL.

In this embodiment, an example is described in which the memory cells 2a, 2b, 2c, and 2d share one memory gate line MGL, one second select gate line SGL, and one source line SL. The present invention is not limited to this example. Each pair of the memory cells 2a and 2b (or 2c and 2d), which are arranged in the second direction (the row direction) may share the memory gate line, the second select gate line, and the source line.

In the non-volatile semiconductor memory device 1, the memory cells 2a, 2b, 2c, and 2d are disposed in one P-type memory well MPW, by way of example. A substrate voltage application circuit 17 applies a substrate voltage to the memory well MPW. In this embodiment, the memory cells 2a, 2b, 2c, and 2d have the same configuration. Hereinafter, the memory cell 2a disposed at an intersection of a first row and a first column will be described.

In the memory cell 2a, the bit line BL1 is connected to a drain region (not shown), which is disposed on a surface of the memory well MPW, and the source line SL is connected to a source region (not shown), which is disposed on the surface of the memory well MPW. A memory gate structure 4, a first select gate structure 5, and a second select gate structure 6 are disposed over the memory well MPW between the drain region and the source region.

In the memory cell 2a, the first select gate structure 5 is disposed on a first sidewall of the memory gate structure 4 through a sidewall spacer (not shown). The memory gate structure 4 is disposed over the memory well MPW between the drain region and the source region. The second select gate structure 6 is disposed on a second sidewall of the memory gate structure 4 through a sidewall spacer. Over the memory well MPW, the first select gate structure 5, the memory gate structure 4, and the second select gate structure 6 are disposed in this order in a direction towards the source line SL from the bit line BL1.

In this embodiment, a first select gate electrode DG of the first select gate structure 5 is disposed through a first select gate insulating film over the memory well MPW between the sidewall spacer and the drain region. The first select gate line DGL1 is connected to the first select gate electrode DG. A channel layer is formed in a surface region of the memory well MPW facing the first select gate electrode DG of the first select gate structure 5, by a voltage difference between the bit voltage and the first select gate voltage. The bit voltage is applied through the bit line BL1 to the drain region disposed on the surface of one end of the memory well MPW, and the first select gate voltage is applied through the first select gate line DGL1 to the first select gate electrode DG.

When the channel layer is formed in the surface region of the memory well MPW facing the first select gate electrode DG of the first select gate structure 5, the bit line BL1 is electrically connected to a channel layer formed in the surface region of the memory well MPW over which the memory gate structure 4 is disposed. Thereby the bit voltage from the bit line BL1 is applied to the channel layer below the memory gate structure 4. On the other hand, when the channel layer is not formed in the surface region of the memory well MPW facing the first select gate electrode DG, the first select gate structure 5 blocks the electrical connection between the bit line BL1 and the channel layer formed in the surface region of the memory well MPW facing the memory gate structure 4. Thus, the first select gate structure 5 prevents the bit voltage (from the bit line BL1) from being applied to the channel layer of the memory gate structure 4.

A second select gate electrode SG of the second select gate structure 6 is disposed, through a second select gate insulating film, over the memory well MPW between the sidewall spacer and the source region. The second select gate line SGL is connected to the second select gate electrode SG. A channel layer is formed in the surface region of the memory well MPW facing the second select gate electrode SG of the second select gate structure 6, by a voltage difference between the source voltage and the second select gate voltage. The source voltage is applied through the source line SL to the source region disposed on the surface of one end of the memory well MPW. The second select gate voltage is applied through the second select gate line SGL to the second select gate electrode SG.

When the channel layer is formed in the surface region of the memory well MPW facing the second select gate electrode SG of the second select gate structure 6, the source line SL is electrically connected to the channel layer formed in the surface region of the memory well MPW over which the memory gate structure 4 is disposed. On the other hand, when the channel layer is not formed in the surface region of the memory well MPW facing the second select gate electrode SG, the second select gate structure 6 blocks the electrical connection between the source line SL and the channel layer below the memory gate structure 4. Thus, the second select gate structure 6 prevents the source voltage (from the source line SL) from being applied to the channel layer of the memory gate structure 4.

The memory gate structure 4 disposed over the memory well MPW between the first select gate structure 5 and the second select gate structure 6 includes a lower gate insulating film, a charge storage layer EC, an upper gate insulating film, and a memory gate electrode MG stacked in this order (from bottom to top) over the memory well MPW. The memory gate line MGL is connected to the memory gate electrode MG. In the above-configured memory gate structure 4, a voltage difference between the memory gate MG and the memory well MPW causes a quantum tunneling effect. Thereby charge is injected into or removed (pulled out) from the charge storage layer EC.

(2) Specific Configuration of Memory Cell

Figure 2:
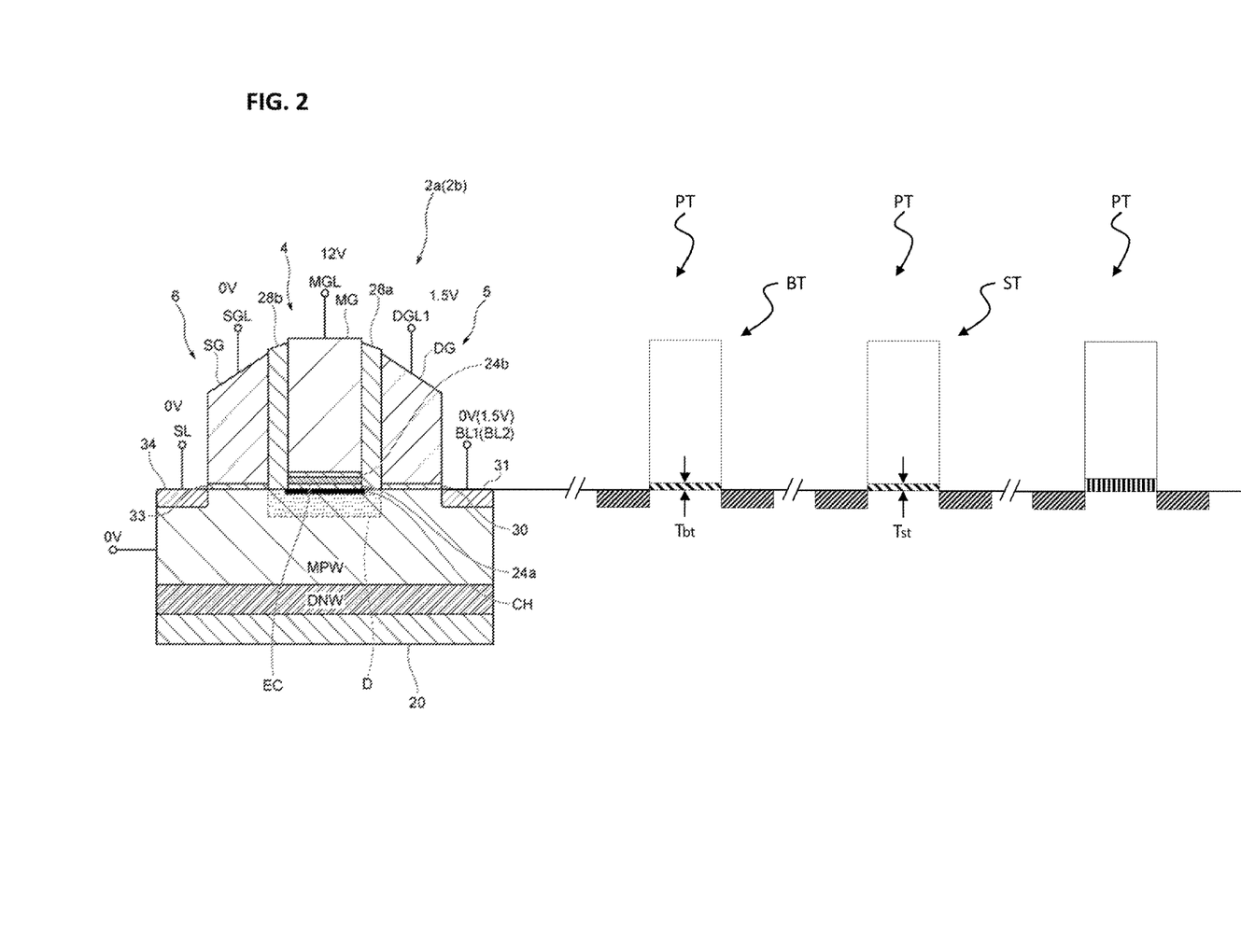
FIG. 2 is a cross-sectional view illustrating a cross section of the memory cell of the present invention.

FIG. 2 shows a cross-sectional view illustrating a cross-section of the memory cell 2a (or 2b) of this embodiment. As illustrated in FIG. 2, in the memory cell 2a, a P-type memory well MPW is disposed over a substrate 20 containing $SiO_2$ or the like, through an N-type deep well layer DNW, by way of example. The memory gate structure 4, the first select gate structure 5, and the second select gate structure 6 are disposed over the memory well MPW. The memory gate structure 4 is included in an N-type transistor structure. The first select gate structure 5 is included in an N-type MOS (Metal-Oxide-Semiconductor) transistor structure. The second select gate structure 6 is included in an N-type MOS transistor structure.

The drain region 31 and the source region 34 are spaced at a predetermined distance from each other on the surface of the memory well MPW. The drain region 31 is disposed at one end of the first select gate structure 5. The source region 34 is disposed at one end of the second select gate structure 6. The bit line BL1 is connected to the drain region 31, and the source line SL is connected to the source region 34. In this embodiment, impurity concentration in each of the drain region 31 and the source region 34 is $1.0E21/cm^3$ or more. The impurity concentration of the surface region (for example, a region from the surface to the depth of 50 nm), in which a channel layer CH is to be formed, of the memory well MPW is $1.0E19/cm^3$ or less, preferably $3.0E18/cm^3$ or less.

The memory gate structure 4 is disposed over the memory well MPW between the drain region 31 and the source region 34. The memory gate structure 4 includes a lower gate insulating film 24a, the charge storage layer EC, an upper gate insulating film 24b, and the memory gate electrode MG stacked in this order. The lower gate insulating film 24a includes an insulating member containing $SiO_2$ or the like. The charge storage layer EC contains silicon nitride ($Si_3N_4$), silicon oxynitride (SiON), or alumina ($Al_2O_3$), for example. The upper gate insulating film 24b includes an insulating member containing $SiO_2$ or the like. The lower gate insulating film 24a and the upper gate insulating film 24b of the memory gate structure 4 isolate the charge storage layer EC from the memory well MPW and the memory gate electrode MG.

The sidewall spacer 28a, which is made of an insulating member, is disposed along the first sidewall of the memory gate structure 4. The memory gate structure 4 is adjacent to the first select gate structure 5 through the sidewall spacer 28a. The sidewall spacer 28a, which is disposed between the memory gate structure 4 and the first select gate structure 5, has the thickness enough to insulate the memory gate structure 4 from the first select gate structure 5.

The first select gate structure 5 includes a first select gate insulating film 30 disposed on the memory well MPW between the sidewall spacer 28a and the drain region 31. The first select gate insulating film 30 includes an insulating member and has the thickness of less than or equal to 9 nm, preferably less than or equal to 3 nm. The first select gate electrode DG, to which the first select gate line DGL1 is connected, is disposed on the first select gate insulating film 30.

In this embodiment, in a case where spacing between the memory gate structure 4 and the first select gate structure 5 is less than 5 nm, breakdown voltage failure may occur at the sidewall spacer 28a when a predetermined voltage is applied to the memory gate electrode MG or the first select gate electrode DG. On the other hand, in a case where the spacing between the memory gate structure 4 and the first select gate structure 5 exceeds 40 nm, the resistance of the memory well MPW between the memory gate electrode MG and the first select gate electrode DG increases, so that a read current is not likely to be generated between the memory gate structure 4 and the first select gate structure 5 during data reading operation, which will be described below. Hence, in this embodiment, it is preferred that the thickness of the sidewall spacer 28a between the memory gate structure 4 and the first select gate structure 5 is greater than or equal to 5 nm and less than or equal to 40 nm.

The sidewall spacer 28b, which is made of an insulating member, is disposed along the second sidewall of the memory gate structure 4. The memory gate structure 4 is adjacent to the second select gate structure 6 through the sidewall spacer 28b. The thickness of the sidewall spacer 28b, which is disposed between the memory gate structure 4 and the second select gate structure 6, is the same as that of the sidewall spacer 28a, and the sidewall spacer 28b insulates the memory gate structure 4 from the second select gate structure 6.

The second select gate structure 6 includes a second select gate insulating film 33 disposed on the memory well MPW between the sidewall spacer 28b and the source region 34. The second select gate insulating film 33 is made of an insulating member and has the thickness of less than or equal to 9 nm, preferably less than or equal to 3 nm. The second select gate electrode SG, to which the second select gate line SGL is connected, is disposed on the second select gate insulating film 33.

In this embodiment, in a case where spacing between the memory gate structure 4 and the second select gate structure 6 is less than 5 nm, breakdown voltage failure may occur at the sidewall spacer 28b when a predetermined voltage is applied to the memory gate electrode MG or the second select gate electrode SG. On the other hand, in a case where the spacing between the memory gate structure 4 and the second select gate structure 6 exceeds 40 nm, the resistance of the memory well MPW between the memory gate electrode MG and the second select gate electrode SG increases, so that a read current is not likely to be generated between the memory gate structure 4 and the second select gate structure 6 during data reading operation, which will be described below. Hence, in this embodiment, it is preferred that the thickness of the sidewall spacer 28b between the memory gate structure 4 and the second select gate structure 6 is greater than or equal to 5 nm and less than or equal to 40 nm.

In this embodiment, the first select gate electrode DG and the second select gate electrode SG are disposed along the sidewalls of the memory gate electrode MG through the sidewall spacers 28a and 28b, and each of the first select gate electrode DG and the second select gate electrode SG has a sidewall shape. The sidewall shape is a shape in which the height of the first select gate electrode DG (or the second select gate electrode SG) decreases with the distance from the memory gate electrode MG such that the top portion of the first select gate electrode DG (or the second select gate electrode SG) is sloped (angled) toward the memory well MPW.

The memory cells 2a, 2b, 2c, and 2d having the above-described configuration are fabricated by a common semiconductor production process using a film formation technique, such as a photolithography technique, oxidization, or CVD, an etching technique, an ion implantation technique, or the like. In this embodiment, descriptions of the semiconductor production process are omitted.

The above-described sidewall-shaped first and second select gate electrodes DG and SG are formed as follows: the memory gate electrode MG including the sidewall spacers 28a and 28b is formed over the memory well MPW; then a conductive layer is formed over the memory well MPW, to cover the respective sidewall spacers 28a and 28b, which are disposed along the sides of the memory gate electrode MG; and thereafter the conductive layers are etched back. Thus the sidewall-shaped first and second select gate electrodes DG and SG are formed along the sidewall spacers 28a and 28b disposed along the sidewalls of the memory gate electrode MG.

As described above, the memory gate electrode MG is formed prior to the first select gate electrode DG and the second select gate electrode SG. In a process after a semiconductor production process for forming the memory gate electrode MG, the first select gate electrode DG and the second select gate electrode SG are formed from the conductive layer(s) different from that of the memory gate electrode MG.

(3) Principles of Operation to Inject Charge into Charge Storage Layer in Selected Memory Cell The following describes an example in which data is programmed into the memory cell 2a by injecting charge into the charge storage layer EC of the memory cell 2a. As illustrated in FIG. 2, in the memory cell (which may be referred to as selected memory cell) 2a in which charge is to be injected into the charge storage layer EC, a charge storage gate voltage of 12 V is applied through the memory gate line MGL to the memory gate electrode MG of the memory gate structure 4. Thereby the channel layer CH is formed along the surface of the memory well MPW facing the memory gate electrode MG. At this time, a gate OFF voltage of 0 V is applied through the second select gate line SGL to the second select gate electrode SG of the second select gate structure 6, and a source OFF voltage of 0 V is applied through the source line SL to the source region 34. Hence a channel layer is not formed in the surface region of the memory well MPW facing the second select gate electrode SG of the second select gate structure 6. Thus, the second select gate structure 6 blocks the electrical connection between the source region 34, to which the source line SL is connected, and the channel layer CH below the memory gate structure 4, and prevents the application of voltage from the source line SL to the channel layer CH of the memory gate structure 4.

The first select gate voltage of 1.5 V is applied through the first select gate line DGL1 to the first select gate electrode DG of the first select gate structure 5, and a charge storage bit voltage of 0 V is applied through the bit line BL1 to the drain region 31. Hence the memory well MPW facing the first select gate electrode DG of the first select gate structure 5 becomes a conductive state. The drain region 31, to which the bit line BL1 is connected, is electrically connected to the channel layer CH below the memory gate structure 4. As a result, the voltage applied to the channel layer CH of the memory gate structure 4 becomes 0 V, which is the charge storage bit voltage. In this case, a substrate voltage of 0 V, which is the same as the charge storage bit voltage, is applied to the memory well MPW.

The voltage applied to the memory gate electrode MG of the memory gate structure 4 becomes 12 V and the voltage applied to the channel layer CH becomes 0 V. Hence a large voltage difference (12 V) between the memory gate electrode MG and the channel layer CH is caused. Due to the quantum tunneling effect resulting from the large voltage difference, charge is injected into the charge storage layer EC and thus data is programmed.

(4) Principles of Operation not to Inject Charge into Charge Storage Layer in Non-selected Memory Cell in which High Charge Storage Gate Voltage is Applied to Memory Gate Electrode In the non-volatile semiconductor memory device 1 shown in FIG. 1, the memory cells 2a, 2b, 2c, and 2d share the memory gate line MGL. For example, in a case where a high charge storage gate voltage is applied to the memory gate line MGL to inject charge only into the charge storage layer EC of the memory cell 2a disposed at the intersection of the first row and the first column, the high charge storage gate voltage is also applied through the memory gate line MGL to the memory gate electrode MG of each of the memory cells (which may be referred to as non-selected memory cells) 2b, 2c, and 2d in which the charge is not supposed to be injected into the charge storage layer EC.

Even when the high charge storage gate voltage is applied through the memory gate line MGL to the memory gate electrode MG of the memory cells 2b, 2c, and 2d, in each of which the charge is not supposed to be injected into the charge storage layer EC, there is no need to apply a high bit voltage to the bit lines BL1 and BL2 in accordance with the high charge storage gate voltage, unlike a conventional case. The charge injection into the charge storage layer EC of the memory gate structure 4 is prevented only by allowing the first select gate structure 5 to block the electrical connection between the bit line BL1 and the channel layer CH below the memory gate structure 4 and by allowing the second select gate structure 6 to block the electrical connection between the source line SL and the channel layer CH of the memory gate structure 4.

Of the memory cells 2b, 2c, and 2d, the memory cell 2b disposed at an intersection of the first row and the second column will be described below. As illustrated in FIG. 2, a charge storage gate voltage of 12 V is applied through the memory gate line MGL to the memory gate electrode MG of the memory gate structure 4 of the memory cell 2b. The charge storage gate voltage is transmitted to the memory well MPW, and the channel layer CH is formed along the surface of the memory well MPW facing the memory gate electrode MG.

A gate OFF voltage of 0 V is applied through the second select gate line SGL to the second select gate electrode SG of the second select gate structure 6 of the memory cell 2b. A source OFF voltage of 0 V is applied through the source line SL to the source region 34. Hence the memory well MPW facing the second select gate electrode SG is in a non-conductive state, and thus the second select gate structure 6 of the memory cell 2b blocks the electrical connection between the source region 34, to which the source line SL is connected, and the channel layer CH of the memory gate structure 4.

The first select gate voltage of 1.5 V is applied through the first select gate line DGL1 to the first select gate electrode of the first select gate structure 5 of the memory cell 2b. An off-voltage of 1.5 V is applied through the bit line BL2 to the drain region 31. Hence the memory well MPW facing the first select gate electrode DG is in the non-conductive state, and thus the first select gate structure 5 blocks the electrical connection between the drain region 31, to which the bit line BL2 is connected, and the channel layer CH of the memory gate structure 4.

As described above, the region of the memory well MPW situated below the first select gate structure 5 and the region of the memory well MPW situated below the second select gate structure 6 become non-conductive state. The memory gate structure 4 of the memory cell 2b is disposed between the first select gate structure 5 and the second gate structure 6. Hence, the electrical connection between the channel layer CH, which faces the memory gate electrode MG and is formed in the surface region of the memory well MPW, and the drain region 31 and the electrical connection between the channel layer CH and the source region 34 are blocked. Thereby, a depletion layer D is formed around the channel layer CH.

Figure 3:
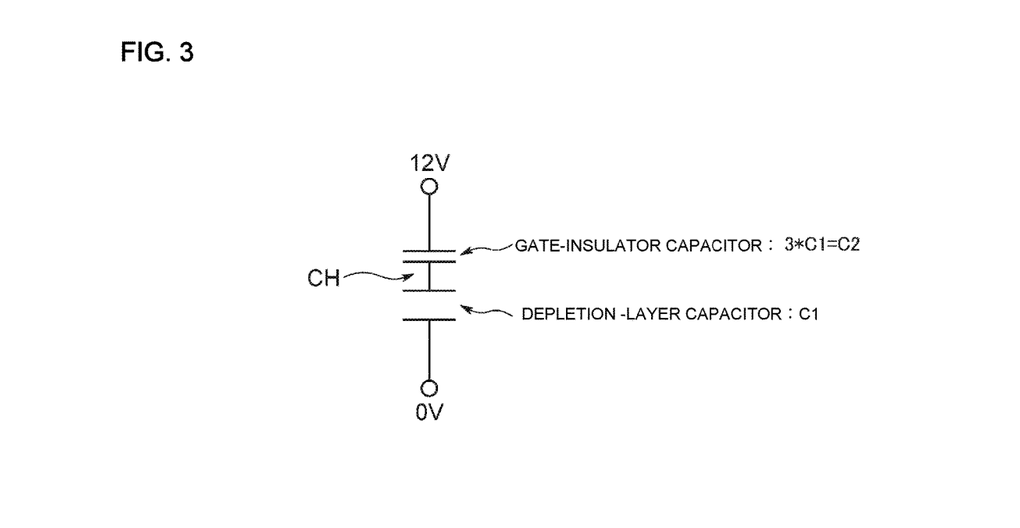
FIG. 3 is a schematic view illustrating a gate-insulator capacitor and a depletion-layer capacitor in a memory gate structure.

Here, C2 refers to a capacitor (hereinafter referred to as gate-insulator capacitor) having a three-layer configuration composed of the upper gate insulating film 24b, the charge storage layer EC, and the lower gate insulating film 24a. C1 refers to a capacitor (hereinafter referred to as depletion-layer capacitor) of the depletion layer D, which is formed in the memory well MPW and surrounds the channel layer CH. As illustrated in FIG. 3, the gate-insulator capacitor C2 is connected in series to the depletion-layer capacitor C1. For example, given that the gate-insulator capacitor C2 has the capacity (gate-insulator capacitance C2) three times as much as the capacity (depletion-layer capacitance C1) of the depletion-layer capacitor C1, the channel potential Vch of the channel layer CH is calculated by a formula below.

$$Vch = \left(\begin{array}{c}\text{MEMORY GATE} \\ \text{VOLTAGE } MV\end{array} - \begin{array}{c}\text{SUBSTRATE} \\ \text{VOLTAGE } CV\end{array}\right) \times \quad \text{[Formula 1]}$$

$$\frac{\text{GATE-INSULATOR CAPACITANCE } C2}{\text{DEPLETION-LAYER CAPACITANCE } C1 + \text{GATE-INSULATOR CAPACITANCE } C2}$$

In this embodiment, the substrate voltage CV of the memory well MPW is 0 V, and the memory gate voltage MV of the memory gate electrode MG is 12 V. Hence, the channel potential Vch is 9 V as shown by a formula below.

$$Vch = (12 \text{ V} - 0 \text{ V}) \times \frac{3 \cdot C1}{C1 + (3 \cdot C1)} = 9 \text{ V} \quad \text{[Formula 2]}$$

Thus, the channel potential Vch of the channel layer CH, which is surrounded by the depletion layer D in the memory well MPW, is 9 V even when the charge storage gate voltage of 12 V is applied to the memory gate electrode MG of the memory gate structure 4. Hence, the voltage difference between the memory gate electrode MG and the channel layer CH is 3 V, which is small. As a result, the quantum tunneling effect does not occur. Thus, the injection of charge into the charge storage layer EC is prevented.

In the memory cell 2b, an impurity diffusion region, in which impurity concentration is high, is not formed in a region of the memory well MPW between the memory gate structure 4 and the first select gate structure 5. Hence the depletion layer D is reliably formed around the channel layer CH formed close to the surface of the memory well MPW. The depletion layer D prevents the channel potential Vch (from the channel layer CH) from being applied to the first select gate insulating film 30.

The depletion layer D blocks the channel potential Vch of the channel layer CH even in a case where the thickness of the first select gate insulating film 30 of the first select gate structure 5 is reduced in accordance with the low bit voltage to be applied through the bit line BL2 to the drain region 31. Thus, the breakdown of the first select gate insulating film 30 due to the channel potential Vch is avoided.

Since an impurity diffusion region, in which impurity concentration is high, is not formed in a region of the memory well MPW between the memory gate structure 4 and the second select gate structure 6, the depletion layer D is reliably formed around the channel layer CH formed close to the surface of the memory well MPW. Thus, the depletion layer D prevents the channel potential Vch (from the channel layer CH) from being applied to the second select gate insulating film 33.

The depletion layer D blocks the channel potential Vch of the channel layer CH even in a case where the thickness of the second select gate insulating film 33 of the second select gate structure 6 is reduced in accordance with the low source voltage to be applied through the source line SL to the source region 34. Thus, the breakdown of the second select gate insulating film 33 due to the channel potential Vch is avoided.

At the time the above-described operation is performed in the selected memory cell 2a or the non-selected memory cell 2b, the channel potential at the start of the operation may vary depending on a state of charge storage in the memory cell 2a or 2b. For example, given that the potential of the bit line BL1, the bit line BL2, or the source line SL is 0 V, the voltage applied to the first select gate electrode DG or the second select gate electrode SG is 1.5 V, and the voltage applied to the memory gate electrode MG is 1.5 V, it is preferred to perform an operation to make each of the channel potentials of the memory cells 2a, 2b, 2c, and 2d equal to the potential of the bit line BL1, the bit line BL2, or the source line SL, before the data programming operation. After the channel potentials of the memory cells 2a, 2b, 2c, and 2d are made equal to the potential of the bit line BL1, the bit line BL2, or the source line SL, the first select gate electrode DG or the second select gate electrode SG is set to the gate OFF voltage (0 V), and then the data programming operation is performed.

Figure 4:
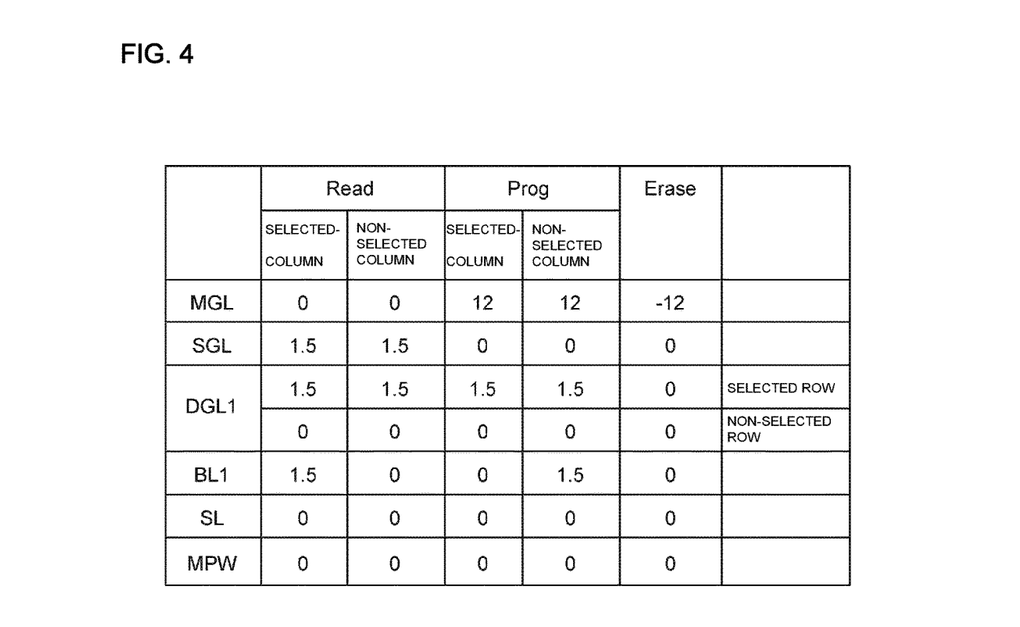
FIG. 4 is a table showing voltage values at respective sites during each of data programming operation, data reading operation, and data erasing operation, by way of example.

(5) Voltages During Various Operations in Non-volatile Semiconductor Memory Device FIG. 4 is a table showing voltage values of respective sites in the non-volatile semiconductor memory device 1 of the present invention at the times of the data programming operation ("Prog" in the table), in which charge is injected into the charge storage layer EC of the memory cell 2a, the data reading operation ("Read" in the table), in which whether charge is stored in the charge storage layer EC of the memory cell 2a is determined, and the data erasing operation ("Erase" in the table), in which charge is removed from the charge storage layer EC of the memory cell 2a or 2C for example.

The column "Read" in FIG. 4 shows the voltage values at the time of the data reading operation. For example, in a selected row having the memory cell 2a from which the data is to be read, the second select gate voltage of 1.5 V is applied to the second select gate line SGL, and the source voltage of 0 V is applied to the source line SL. Hence the region of the memory well MPW over which the second select gate structure 6 of the memory cell 2a is disposed becomes a conductive state, and thus the source line SL is electrically connected to the channel layer CH below the memory gate structure 4. The first select gate voltage of 1.5 V is applied to the first select gate line DGL1 connected to the first select gate structure 5 of the memory cell 2a from which data is to be read, and the readout voltage of 1.5 V is applied to the bit line BL1 connected to the drain region 31 adjacent to the first select gate structure 5.

A voltage of 0 V is applied through the memory gate line MGL to the memory gate electrode MG of the memory gate structure 4 of the memory cell 2a from which data is to be read. In a case where charge has been stored (in a case where data has been programmed) in the charge storage layer EC of the memory gate structure 4 of the memory cell 2a from which data is to be read, the region of the memory well MPW below the memory gate structure 4 is in the non-conductive state. Thus the memory gate structure 4 blocks the electrical connection between the first select gate structure 5 and the second select gate structure 6. Hence, the readout voltage of 1.5 V applied to the bit line BL1 connected to the drain region adjacent to the first select gate structure 5 of the memory cell 2a, from which data is to be read, is maintained.

In a case where charge has not been stored (in a case where data has not been programmed) in the charge storage layer EC of the memory gate structure 4 of the memory cell 2a from which data is to be read, the region of the memory well MPW below the memory gate structure 4 is in the conductive state. The first select gate structure 5 is electrically connected to the second select gate structure 6 through the memory gate structure 4. Hence, the source line SL, to which 0 V is applied, is electrically connected to the bit line BL1, to which 1.5 V is applied, through the memory cell 2a. The readout voltage applied to the bit line BL1 is applied to the source line SL of 0V, so that the readout voltage applied to the bit line BL1 drops from 1.5 V. Thus, whether the charge has been stored in the charge storage layer EC of the memory cell 2a of the non-volatile semiconductor memory device 1 is determined by detecting a change in the readout voltage applied to the bit line BL1.

As shown in the column "Non-selected row" in FIG. 4, 0 V is applied to the first select gate line DGL1 of the memory cell 2c (FIG. 1). The memory cell 2c is connected to the bit line BL1, to which the readout voltage of 1.5 V is applied, and data is not read from the memory cell 2c. Hence, the region of the memory well MPW below the first select gate structure 5 becomes the non-conductive state. Thus, a state of charge storage in the charge storage layer EC is prevented from affecting the readout voltage applied to the bit line BL1.

The column "Erase" in FIG. 4 shows the voltage values during the erasing operation, in which charge is removed from the charge storage layer EC of the memory cell 2a or 2c in the non-volatile semiconductor memory device 1. In this case, the memory gate voltage of −12 V is applied through the memory gate line MGL to the memory gate electrode MG of the memory gate structure 4 of the memory cell 2a or 2c. Hence, the charge in the charge storage layer EC is transferred to the memory well MPW, to which 0 V is applied, and thus the data is erased.

The column "Prog" in FIG. 4 shows a voltage value (at an intersection between "selected column" and "selected row") in a case where charge is injected into the charge storage layer EC of the memory cell 2a and voltage values (in "non-selected column" or "non-selected row") in a case where charge is not injected into the charge storage layer EC of the memory cell 2a. The descriptions similar to those in "(3) Principles of operation to inject charge into charge storage layer in selected memory cell" and "(4) Principles of operation not to inject charge into charge storage layer in non-selected memory cell in which high charge storage gate voltage is applied to memory gate electrode" are omitted.

Figure 5A:
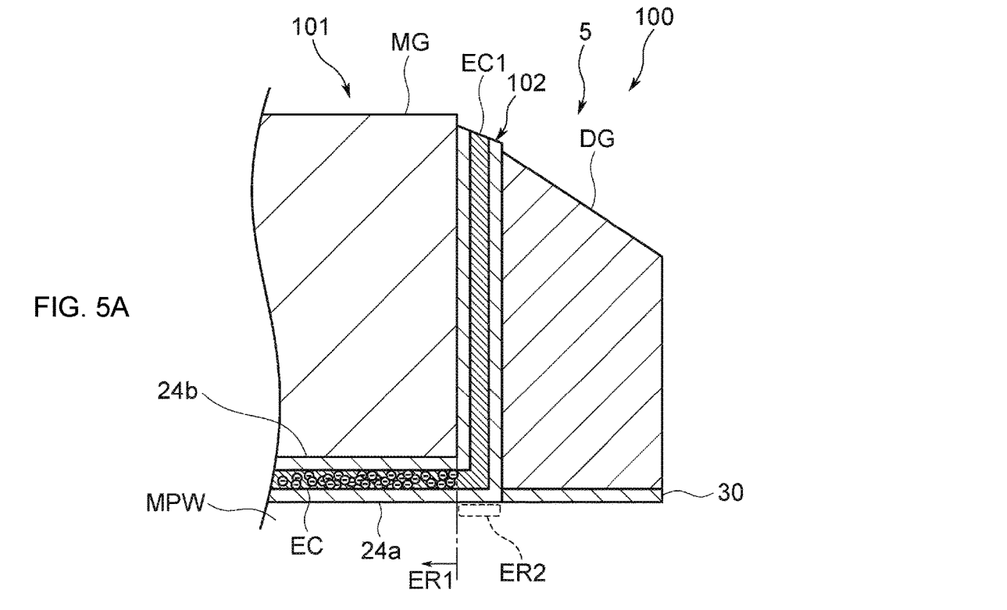
FIG. 5A is a schematic view illustrating a state immediately after charge injection into a charge storage layer in a memory cell of a comparative example 1, in which the charge storage layer is disposed in a sidewall spacer between a memory gate electrode and a first select gate electrode.

(6) Configuration of Charge Storage Layer in Memory Cell of the Present Invention FIG. 5A, in which parts corresponding to those in FIG. 2 are denoted by the same reference numerals, illustrates a memory cell 100 of a comparative example 1. The memory cell 100 differs from the memory cell 2a of the present invention illustrated in FIG. 2 in that a charge storage layer EC1 is disposed in a sidewall spacer 102. The sidewall spacer 102 is disposed between the memory gate electrode MG and the first select gate electrode DG. Although FIG. 5A shows only the charge storage layer EC1 disposed between the memory gate electrode MG and the first select gate electrode DG, the charge storage layer is disposed also in a sidewall spacer between the memory gate electrode MG and the second select gate electrode SG (not shown in FIG. 5A).

The charge storage layer EC1 of the comparative example extends from an end of the charge storage layer EC disposed in a region ER1 below the memory gate electrode MG to a region between the memory gate electrode MG and the first select gate electrode DG, and is bent at a right angle. The charge storage layer EC1 further extends inside the sidewall spacer 102, which is disposed between the memory gate electrode MG and the first select gate electrode DG, and along a sidewall of the memory gate electrode MG.

Figure 5B:
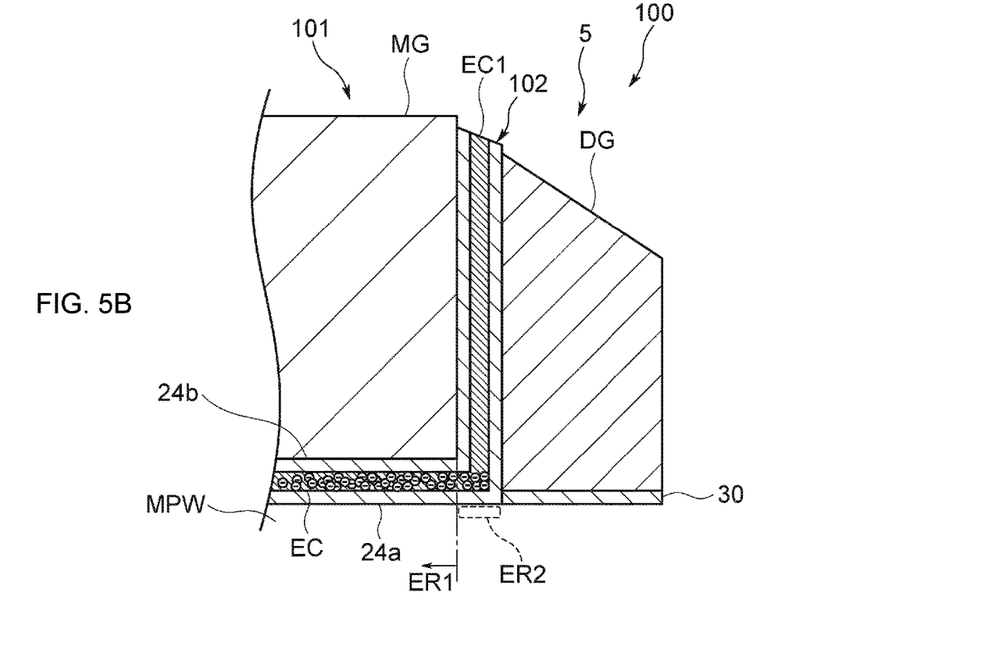
FIG. 5B is a schematic view illustrating diffusion of the charge in the charge storage layer with time after the injection of charge into the charge storage layer of FIG. 5A.

In the memory cell 100 of the comparative example 1, which includes the charge storage layers EC and EC1, charge is injected from the memory well MPW to the charge storage layer EC due to the quantum tunneling effect caused by the voltage difference between the memory gate electrode MG and the channel layer (not shown) formed in the surface region of the memory well MPW. However, as illustrated in FIG. 5B, in which parts corresponding to those in FIG. 5A are denoted by the same reference numerals, in the memory cell 100 of the comparative example 1, the charge stored in the charge storage layer EC may diffuse gradually into the charge storage layer EC1, which is disposed between the memory gate electrode MG and the first select gate electrode DG, with time. The charge may be stored not only in the charge storage layer EC but also in the charge storage layer EC1, which is directly above a region ER2 of the memory well MPW between the memory gate electrode MG and the first select gate electrode DG.

As described above, in a case where the charge is stored also in the charge storage layer EC1, which is directly above the region ER2 of the memory well MPW between the memory gate electrode MG and the first select gate electrode DG, in the memory cell 100 of the comparative example 1, the resistance of the region ER2 increases. Hence a memory current drops in a reading operation, and it becomes difficult to enhance reading performance and the speed of the operation.

Figure 6:
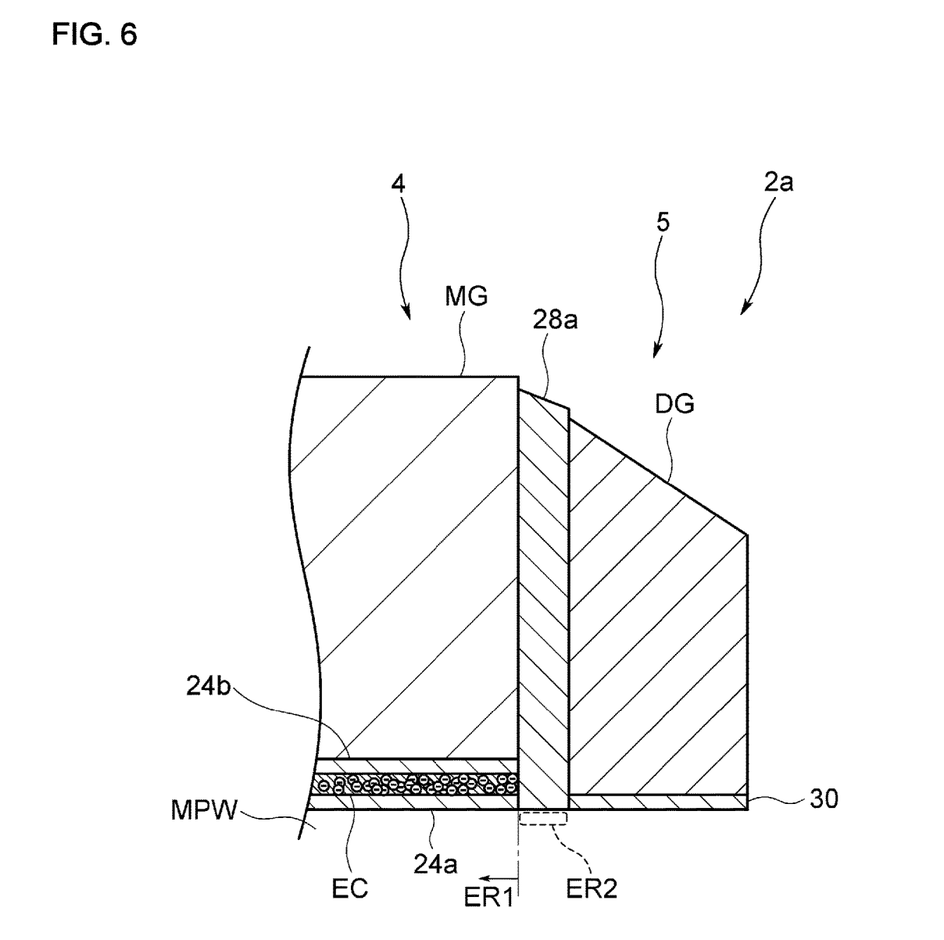
FIG. 6 is a schematic view illustrating a state in which charge is injected into the charge storage layer in a memory cell of the present invention.

In the memory cell 2a of the present invention as illustrated in FIG. 6, on the other hand, the charge storage layer EC is disposed only in the region ER1 through which the memory gate electrode MG faces the memory well MPW. The charge storage layer is in neither of the sidewall spacer 28a, which is disposed between the memory gate electrode MG and the first select gate electrode DG, nor the sidewall spacer 28b, which is disposed between the memory gate electrode MG and the second select gate electrode SG (not shown in FIG. 6).

In the case where the charge is injected into the charge storage layer EC in the memory cell 2a, the sidewall spacers 28a and 28b prevent the charge in the charge storage layer EC from reaching near the first select gate electrode DG and the second select gate electrode SG. The charge is maintained within the region ER1 below the memory gate electrode MG. Thus, the charge is prevented from being stored in a region directly above the region ER2 of the memory well MPW between the memory gate electrode MG and the first select gate electrode DG. As a result, in the memory cell 2a, the resistance value of the region ER2 of the memory well MPW between the memory gate electrode MG and the first select gate electrode DG is kept low, to enhance the reading performance and the speed of the operation.

(7) Operation and Effect

The above-configured memory cell 2a includes the memory gate structure 4 disposed over the memory well MPW between the drain region 31 and the source region 34. The memory gate structure 4 includes the lower gate insulating film 24a, the charge storage layer EC, the upper gate insulating film 24b, and the memory gate electrode MG stacked in this order. The first select gate structure 5 is disposed adjacent to and along the first sidewall of the memory gate structure 4 through the sidewall spacer 28a. The second select gate structure 6 is disposed adjacent to and along the second sidewall of the memory gate structure 4 through the sidewall spacer 28b.

The first select gate electrode DG of the first select gate structure 5 is disposed, through the first select gate insulating film 30, over the memory well MPW between the drain region 31, to which the bit line BL1 is connected, and the sidewall spacer 28a provided on the sidewall of the memory gate structure 4. The second select gate electrode SG of the second select gate structure 6 is disposed, through the second select gate insulating film 33, over the memory well MPW between the source region 34, to which the source line SL is connected, and the sidewall spacer 28b provided on the sidewall of the memory gate structure 4.

In the case where charge is not to be injected into the charge storage layer EC of the memory cell 2a, the first select gate structure 5 blocks the electrical connection between the drain region 31 and the channel layer CH and the second select gate structure 6 blocks the electrical connection between the source region 34 and the channel layer CH even when the charge storage gate voltage, which is necessary for charge injection into the charge storage layer EC, is applied to the memory gate electrode MG and the channel layer CH is formed in the surface region of the memory well MPW facing the memory gate electrode MG.

Thereby, in the memory cell 2a, the depletion layer D is formed around the channel layer CH, and the channel potential Vch of the channel layer CH is raised in accordance with the charge storage gate voltage, and the voltage difference between the memory gate electrode MG and the channel layer CH decreases. Thus, the depletion layer D blocks the voltage to be applied from the channel layer CH to the first and second select gate insulating films 30 and 33 while preventing the injection of charge into the charge storage layer EC.

Hence, in the memory cell 2a, the voltages applied to the bit line BL1 and the source line SL are reduced to allow the first select gate structure 5 and the second select gate structure 6 to block the electrical connection between the bit line BL1 and the channel layer CH and the electrical connection between the source line SL and the channel layer CH, without being constrained by the high charge storage gate voltage needed to inject charge into the charge storage layer EC by the quantum tunneling effect. The reduction in voltages applied to the bit line BL1 and the source line SL allows reduction in the thickness of the first select gate insulating film 30 of the first select gate structure 5 and the thickness of the second select gate insulating film 33 of the second select gate structure 6 in the memory cell 2a. The high-speed operation is achieved correspondingly.

In the memory cell 2a of the present invention, the voltages to be applied to the bit line BL1 and the source line SL are reduced. Hence, the thickness of a gate insulating film of a field effect transistor in the peripheral circuit that controls the memory cell 2a is reduced. The area of the peripheral circuit is reduced correspondingly.

As illustrated in FIG. 1, the non-volatile semiconductor memory device 1, which is provided with the memory cells 2a, 2b, 2c, and 2d arranged in the matrix of rows and columns, includes the bit voltage application circuit 10, the first select gate voltage application circuit 11, the memory gate voltage application circuit 13, the second select gate voltage application circuit 14, the source voltage application circuit 15, and the substrate voltage application circuit 17. In any of the operations such as injecting charge into the charge storage layer EC of the memory cell 2a or removing charge from the charge storage layer EC of each of the memory cells 2a, 2b, 2c, and 2d, each of the voltages to be applied to the bit lines BL1 and BL2, the first select gate lines DGL1 and DGL2, the source line SL, and the second select gate line SGL is less than or equal to 1.5 V, for example.

Hence, in the non-volatile semiconductor memory device 1 of the present invention, peripheral circuits of the bit voltage application circuit 10, the first select gate voltage application circuit 11, the second select gate voltage application circuit 14, the memory gate voltage application circuit 13, the source voltage application circuit 15, and the substrate voltage application circuit 17, and other various peripheral circuits such as CPU (central processing unit), ASIC (application-specific integrated circuit), a logic circuit, and an input and output circuit, in each of which the maximum operating voltage is set to 1.5 V, for example, are embedded with the memory cells 2a, 2b, 2c, and 2d and the bit voltage application circuit 10 and the like, over one semiconductor substrate.

In this case, in the non-volatile semiconductor memory device 1 of the present invention, it is preferred that the thickness of each of the first select gate insulating film 30 and the second select gate insulating film 33 disposed in, for example, each of the memory cells 2a, 2b, 2c, and 2d is less than or equal to the thickness of the thinnest one of the gate insulating films of the field effect transistors (PTs) in the peripheral circuits. It is preferred that the thickness of each of the first select gate insulating film 30 and the second select gate insulating film 33 is the same as the thickness of the gate insulating film (Tbt) of the field effect transistor (BT) in the bit voltage application circuit 10 connected to the bit lines BL1 and BL2 and the thickness of the gate insulating film (Tst) of the field effect transistor (ST) in the source voltage application circuit 15 connected to the source line SL.

The thickness of each of the first select gate insulating film 30 and the second select gate insulating film 33 embedded with the peripheral circuits over the semiconductor substrate is reduced, and the high-speed operation of the non-volatile semiconductor memory device 1 of the present invention is achieved correspondingly. The areas of the peripheral circuits disposed adjacent to the memory cells 2a, 2b, 2c, and 2d are also reduced.

Figure 7A:
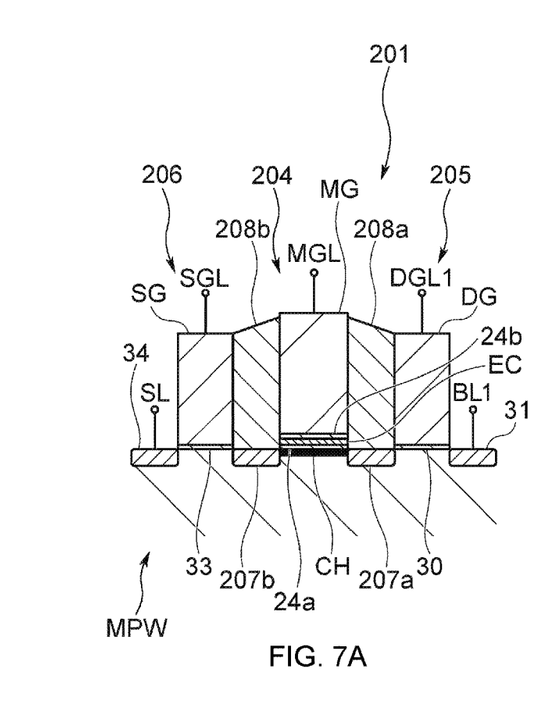
FIG. 7A is a memory cell of a comparative example 2, in which an impurity diffusion region is disposed on each of a surface of a memory well between the memory gate structure and a first select gate structure and the surface of a memory well between the memory gate structure and a second select gate structure.

A memory cell 201 illustrated in FIG. 7A will be described below. In FIG. 7A, parts corresponding to those of the memory cell 2a of the present invention illustrated in FIG. 2 are denoted by the same reference numerals. The memory cell 201 illustrated in FIG. 7A represents a comparative example 2. The memory cell 201 differs from the memory cell 2a illustrated in FIG. 2 in that an impurity diffusion region 207a and an impurity diffusion region 207b are disposed. The impurity diffusion region 207a is disposed in a surface region of the memory well MPW between a memory gate structure 204 and a first select gate structure 205. The impurity diffusion region 207b is disposed in a surface region of the memory well MPW between the memory gate structure 204 and a second select gate structure 206.

In a case where charge is not to be injected into the charge storage layer EC of the memory cell 201 of the comparative example 2, a channel layer CH, in which the potential is raised in accordance with the charge storage gate voltage, is formed in a surface region of the memory well MPW facing the memory gate electrode MG when the charge storage gate voltage of 12 V is applied to the memory gate electrode MG, in a manner similar to the above-described embodiments.

In the memory cell 201 of the comparative example 2, the impurity diffusion regions 207a and 207b are disposed on the surface of the memory well MPW lying on both sides of the memory gate structure 204. Impurity concentration(s) of the impurity diffusion regions 207a and 207b is higher than that of the memory well MPW in which the channel layer CH is formed. Hence the channel potential of the channel layer CH is applied to the first select gate insulating film 30 and the second select gate insulating film 33 through the impurity diffusion regions 207a and 207b.

For this reason, a problem arises that the breakdown of the first select gate insulating film 30 or the second select gate insulating film 33 may occur due to the channel potential applied from the impurity diffusion region 207a or 207b in the case where the thickness of the first select gate insulating film 30 or the second select gate insulating film 33 in the memory cell 201 of the comparative example 2 is small.

Figure 7B:
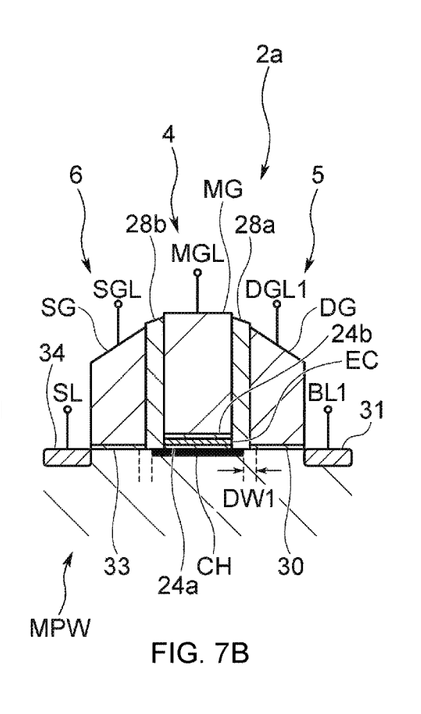
FIG. 7B is a schematic view illustrating the width of a depletion layer in the memory cell of the present invention.

In the memory cell 2a of the present invention illustrated in FIG. 7B, in which parts corresponding to those in FIG. 2 are denoted by the same reference numerals, the impurity diffusion region is not formed in the surface region of the memory well MPW between the memory gate structure 4 and the first select gate structure 5 and in the surface region of the memory well MPW between the memory gate structure 4 and the second select gate structure 6. The impurity concentration in each of the above-described surface regions of the memory well MPW is the same as that in the region of the memory well MPW in which the channel layer CH is formed. Hence, the application of the channel potential Vch from the channel layer CH to the first and second select gate insulating films 30 and 33 is blocked by the depletion layer having a width DW1 and formed around the channel layer CH. The electric field applied from the channel layer CH having the channel potential Vch to the first select gate insulating film 30 and the second select gate insulating film 33 is relaxed by the depletion layer.

As described above, in the memory cell 2a of the present invention, the application of the channel potential Vch from the channel layer CH to the first select gate insulating film 30 and the second select gate insulating film 33 is reliably blocked. Thereby the breakdown of the first select gate insulating film 30 and the second select gate insulating film 33 is avoided even when the thickness of the first select gate insulating film 30 and the thickness of the second select gate insulating film 33 are reduced in accordance with the low voltage(s) applied through the bit line BL1 and the source line SL.

In a case where the width DW1 of the depletion layer is made larger than the thickness of the first select gate insulating film 30 or the second select gate insulating film 33, the electric field applied to the first select gate insulating film 30 or the second select gate insulating film 33 is less than or equal to approximately half the electric field applied to the memory cell 201 of the comparative example 2 illustrated in FIG. 7A. In this embodiment, as illustrated in FIG. 4 by way of example, the maximum voltage applied to each of the bit line BL1 and the source line SL in each of the operations is reduced to less than or equal to 1.5 V. Correspondingly, the thickness of each of the first select gate insulating film 30 and the second select gate insulating film 33 is less than or equal to 9 nm.

(8) Other Embodiments

Figure 7C:
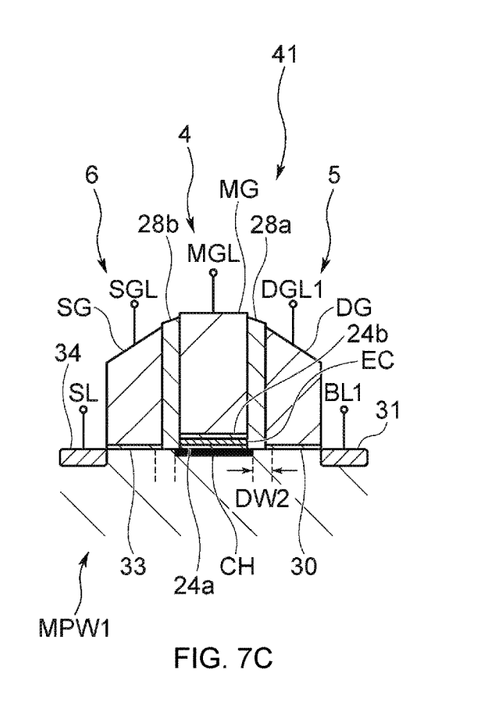
FIG. 7C is a schematic view illustrating the width of the depletion layer in a case where impurity concentration in the memory well is changed.

The present invention is not limited to this embodiment and various modifications are possible within the scope of the present invention. For example, the impurity concentration in the surface region, in which the channel layer CH is to be formed, in the memory well may be less than or equal to $3E18/cm^3$. FIG. 7C, in which parts corresponding to those in FIG. 7B are denoted by the same reference numerals, shows a memory cell 41 of the present invention. The memory cell 41 includes a memory well MPW1. In the memory well MPW1, the impurity concentration of a surface region, in which the channel layer CH is to be formed, is less than or equal to $3E18/cm^3$.

Similar to the above embodiments, the regions of the memory well MPW1 facing the first select gate structure 5 and the second select gate structure 6 are in the non-conductive state even when a high charge storage gate voltage is applied to the memory gate electrode MG in the memory cell 41 and the channel layer CH is formed in the surface region of the memory well MPW1 facing the memory gate electrode MG. Hence, the depletion layer (not shown) is formed around the channel layer CH formed in the surface region of the memory well MPW1 facing the memory gate structure 4. Thus, the injection of charge into the charge storage layer EC is prevented.

In the memory cell 41, which employs the memory well MPW1 having the impurity concentration of less than or equal to $3E18/cm^3$, the depletion layer formed around the channel layer CH has an increased width DW2. The electric field applied to the first select gate insulating film 30 and the second select gate insulating film 33 is relaxed in accordance with the increase in the width DW2 of the depletion layer. As a result, the thickness of the first select gate insulating film 30 and the thickness of the second select gate insulating film 33 are further reduced. For example, when the depletion layer is formed around the channel layer, the electric field applied to the first and second select gate insulating films 30 and 33 in the memory cell 41, which employs the memory well MPW1 having the impurity concentration of less than or equal to $3E18/cm^3$, is approximately ¼ of the electric field applied to the first and second select gate insulating films 30 and 33 in the memory cell 2a (see FIG. 2), which employs the memory well MPW having the impurity concentration of less than or equal to $1.0E19/cm^3$. Accordingly, each of the thickness of the first select gate insulating film 30 and the thickness of the second select gate insulating film 33 is reduced to the thickness of less than or equal to 3 nm.

The impurity concentration of a region from the surface to the depth of 50 nm in the memory well MPW1 between the first select gate electrode DG and the second select gate electrode SG may be less than or equal to 3E18/cm³. Hence, the electric field applied from the channel layer CH to the first select gate insulating film 30 and the second select gate insulating film 33 is relaxed by the depletion layer formed. Accordingly, each of the thickness of the first select gate insulating film 30 and the thickness of the second select gate insulating film 33 is formed to be less than or equal to 3 nm.

In the above embodiments, the p-type memory well MPW is used, and the memory gate structure 4 included in the N-type transistor structure, the first select gate structure 5 included in the N-type MOS transistor structure, and the first select gate structure 6 included in the N-type MOS transistor are provided. The present invention is not limited to such embodiments. An N-type memory well may be used, and a memory gate structure included in a P-type transistor structure, a first select gate structure included in a P-type MOS transistor structure, and a second select gate structure included in a P-type MOS transistor may be provided.

In this case, polarities (the N type and the P type) are opposite to those of the memory cell 2a. The voltages to be applied to the memory gate structure, the first select gate structure, the second select gate structure, the bit line, and the source line may change correspondingly. Similar to the above embodiments, the voltages(s) applied to the bit line and the source line is reduced such that the regions of the memory well facing the first select gate structure and the second select gate structure become the non-conductive state, without being constrained by the charge storage gate voltage applied to the memory gate electrode. Since the voltage(s) applied to the bit line and the source line is reduced, the thickness of the first select gate insulating film of the first select gate structure and the thickness of the second select gate insulating film of the second select gate structure are reduced. The high-speed operation is achieved correspondingly. The areas of the peripheral circuits are also reduced.

In the above embodiments, data is programmed by injecting charge into the charge storage layer EC of the memory cell 2a and erased by removing charge from the charge storage layer EC. The present invention is not limited to such embodiments. Data may be programmed by removing charge from the charge storage layer EC of the memory cell 2a and erased by injecting charge into the charge storage layer EC.

The voltage values for the non-volatile semiconductor memory device 1 of the present invention are not limited to those shown in FIG. 4. Various voltage values other than those described above may be used as long as the voltage values allow injection of charge into the charge storage layer EC of the memory gate structure 4 through the quantum tunneling effect, or as long as the voltage values allow the regions of the memory well MPW facing the first select gate structure 5 and the second select gate structure 6 to be in the non-conductive state and thereby allowing the formation of the depletion layer D around the channel layer CH in the memory well MPW facing the memory gate structure 4, to prevent the injection of charge into the charge storage layer EC. In the data reading operation, the voltage values at the respective sites may take various values as long as the voltage values enable reading out of information indicating whether charge has been stored in the charge storage layer EC of each of the memory cells 2a, 2b, 2c, and 2d.

REFERENCE SIGNS LIST 1 non-volatile semiconductor memory device
2a, 2b, 2c, 2d memory cell
4 memory gate structure
5 first select gate structure
6 second select gate structure
30 first select gate insulating film
31 drain region
33 second select gate insulating film
34 source region
CH channel layer
D depletion layer
BL1, BL2 bit line
SL source line
MGL memory gate line
DGL1, DGL2 first select gate line
SGL second select gate line
MPW, MPW1 memory well
MG memory gate electrode
DG first select gate electrode
SG second select gate electrode
EC charge storage layer

The invention claimed is:

1. A memory cell comprising:
a drain region disposed on a surface of a memory well, a bit line being connected to the drain region;
a source region disposed on the surface of the memory well, a source line being connected to the source region;
a memory gate structure disposed between the drain region and the source region, the memory gate structure including a lower memory gate insulating film, a charge storage layer, an upper memory gate insulating film, and a memory gate electrode stacked in this order over the memory well;
a first select gate structure including a first select gate electrode and a first select gate insulating film, the first select gate electrode being disposed through the first select gate insulating film over the memory well between the drain region and the memory gate structure, the first select gate structure being adjacent to a first sidewall of the memory gate structure through a first sidewall spacer; and
a second select gate structure including a second select gate electrode and a second select gate insulating film, the second select gate electrode being disposed through the second select gate insulating film over the memory well between the source region and the memory gate structure, the second select gate structure being adjacent to a second sidewall of the memory gate structure through a second sidewall spacer;
wherein: the charge storage layer of the memory gate structure is disposed only in a region through which the memory gate electrode faces the memory well, and the charge storage layer is in neither of the first sidewall spacer nor the second sidewall spacer, the first sidewall spacer being disposed between the memory gate structure and the first select gate structure, the second sidewall spacer being disposed between the memory gate structure and the second select gate structure;
each of the first select gate electrode and the second select gate electrode has a sidewall shape with respect to the memory gate electrode, the first and second select gate electrodes being disposed along the first and second sidewalls of the memory gate electrode through the first and second sidewall spacers, the first and second select gate electrodes facing each other; and
impurity concentration of a region from the surface to a depth of 50 nm in the memory well between the first select gate electrode and the second select gate electrode is less than or equal to 3E18/cm$^3$, and a thickness of each of the first select gate insulating film and the second select gate insulating film is less than or equal to 3 nm.

2. A non-volatile semiconductor memory device comprising memory cells arranged in a matrix of rows and columns, at least one bit line and at least one source line being connected to the memory cells, peripheral circuits being disposed adjacent to the memory cells, the memory cells comprising:
   a drain region disposed on a surface of a memory well, a bit line being connected to the drain region;
   a source region disposed on the surface of the memory well, a source line being connected to the source region;
   a memory gate structure disposed between the drain region and the source region, the memory gate structure including a lower memory gate insulating film, a charge storage layer, an upper memory gate insulating film, and a memory gate electrode stacked in this order over the memory well;
   a first select gate structure including a first select gate electrode and a first select gate insulating film, the first select gate electrode being disposed through the first select gate insulating film over the memory well between the drain region and the memory gate structure, the first select gate structure being adjacent to a first sidewall of the memory gate structure through a first sidewall spacer; and
   a second select gate structure including a second select gate electrode and a second select gate insulating film, the second select gate electrode being disposed through the second select gate insulating film over the memory well between the source region and the memory gate structure, the second select gate structure being adjacent to a second sidewall of the memory gate structure through a second sidewall spacer;
   wherein: the charge storage layer of the memory gate structure is disposed only in a region through which the memory gate electrode faces the memory well, and the charge storage layer is in neither of the first sidewall spacer nor the second sidewall spacer, the first sidewall spacer being disposed between the memory gate structure and the first select gate structure, the second sidewall spacer being disposed between the memory gate structure and the second select gate structure;
   each of the first select gate electrode and the second select gate electrode has a sidewall shape with respect to the memory gate electrode, the first and second select gate electrodes being disposed along the first and second sidewalls of the memory gate electrode through the first and second sidewall spacers, the first and second select gate electrodes facing each other; and
   a thickness of each of the first select gate insulating film and the second select gate insulating film in each memory cell is less than or equal to a thickness of a thinnest one of gate insulating films of field effect transistors in the peripheral circuits, and the thickness of each of the first select gate insulating film and the second select gate insulating film is the same as a thickness of a gate insulating film of a field effect transistor in a bit voltage application circuit connected to the at least one bit line and a thickness of a gate insulating film of a field effect transistor in a source voltage application circuit connected to the at least one source line.

3. A memory cell comprising:
   a drain region disposed on a surface of a memory well, a bit line being connected to the drain region;
   a source region disposed on the surface of the memory well, a source line being connected to the source region;
   a memory gate structure disposed between the drain region and the source region, the memory gate structure including a lower memory gate insulating film, a charge storage layer, an upper memory gate insulating film, and a memory gate electrode stacked in this order over the memory well;
   a first select gate structure including a first select gate electrode and a first select gate insulating film, the first select gate electrode being disposed through the first select gate insulating film over the memory well between the drain region and the memory gate structure, the first select gate structure being adjacent to a first sidewall of the memory gate structure through a first sidewall spacer; and
   a second select gate structure including a second select gate electrode and a second select gate insulating film, the second select gate electrode being disposed through the second select gate insulating film over the memory well between the source region and the memory gate structure, the second select gate structure being adjacent to a second sidewall of the memory gate structure through a second sidewall spacer;
   wherein: the charge storage layer is disposed only in a region through which the memory gate electrode faces the memory well, and the charge storage layer is in neither of the first sidewall spacer nor the second sidewall spacer, the first sidewall spacer being disposed between the memory gate structure and the first select gate structure, the second sidewall spacer being disposed between the memory gate structure and the second select gate structure; and
   a width of each of the first sidewall spacer and the second sidewall spacer is greater than or equal to 5 nm and less than or equal to 40 nm, and a thickness of each of the first select gate insulating film and the second select gate insulating film is less than or equal to 3 nm.

4. The memory cell according to claim 3, wherein each of the first select gate electrode and the second select gate electrode has a sidewall shape with respect to the memory gate electrode.

* * * * *